United States Patent

Shimomuki et al.

[11] Patent Number: 6,085,966
[45] Date of Patent: Jul. 11, 2000

[54] SPUTTERING TARGET ASSEMBLY PRODUCTION METHOD

[75] Inventors: Hitoshi Shimomuki; Fumio Sasaki; Eiichi Shimizu, all of Miyagi, Japan

[73] Assignee: Sony Corporation, Tokyo, Japan

[21] Appl. No.: 08/984,130

[22] Filed: Dec. 3, 1997

[30] Foreign Application Priority Data

Dec. 4, 1996 [JP] Japan ..................... 8-324263

[51] Int. Cl.$^7$ .......................... B23K 20/00; B23K 31/02; B23K 1/19; C22F 1/09
[52] U.S. Cl. ................... 228/193; 228/234.1; 228/262.5; 228/262.71; 148/535
[58] Field of Search ................................. 228/193, 172, 228/164, 170, 174, 262.5, 262.71, 234.1; 148/535, 537

[56] References Cited

U.S. PATENT DOCUMENTS

| | | | |
|---|---|---|---|
| 4,817,858 | 4/1989 | Verpoort | 228/193 |
| 4,860,939 | 8/1989 | Guinet et al. | 228/122 |
| 4,896,816 | 1/1990 | Lascar et al. | 228/122 |
| 5,693,203 | 12/1997 | Ohhashi et al. | 204/298.12 |
| 5,807,443 | 9/1998 | Masuda et al. | 148/535 |
| 5,836,506 | 11/1998 | Hunt et al. | 228/172 |

OTHER PUBLICATIONS

Japanese Industrial Standard JIS B 0601–1994.

*Primary Examiner*—Patrick Ryan
*Assistant Examiner*—Kiley Stoner
*Attorney, Agent, or Firm*—Hill & Simpson

[57] ABSTRACT

A method for producing a sputtering target assembly consisting of a target member used for sputtering and a backing plate bonded to the target member, which assembly has a high adherence strength and a high bonding strength as well as a sufficient tensile strength even under a high temperature. When producing a sputtering target assembly consisting of a target member used for sputtering and a backing plate bonded to the target member, bonding surfaces of the target member and the backing plate are made flat so as to have an arithmetic mean roughness Ra of 0.01 to 1.0 μm before carrying out solid phase diffusion bonding between the target member and the backing plate.

12 Claims, 6 Drawing Sheets

SPUTTERING TARGET ASSEMBLY PRODUCTION METHOD

BACKGROUND OF THE INVENTION

1. Field of the Invention

The present invention relates to a method for producing a sputtering target assembly consisting of a target member used for sputtering and a backing plate which is bonded to the target member.

2. Description of the Prior Art

The sputtering target is a sputtering source for forming on a substrate an electrode, wiring, element, protection film or the like of various semiconductor devices. In the field of the semiconductor device, materials mainly used as sputtering targets are aluminium, aluminium alloy, metal having a high melting point (such as Ti, TiW, W, Mo or the like), and silicide having a high melting point (such as $MoSi_x$, $CoSi_x$, $WSi_x$ or the like). These materials are normally formed into a disk shape for use as a sputtering target.

When forming a film by sputtering, accelerated particles are applied to a surface of the sputtering target. When the particles collide onto the surface, according to the exchange of the momentum, atoms constituting the sputtering target are discharged into a space. The particles discharged from the sputtering target are accumulated on a substrate placed opposite to the sputtering target, so as to form a thin film.

The sputtering target is normally used in an assembly state with a backing plate bonded to the sputtering target for support and cooling. That is, the sputtering target consists of a target member as a sputtering source in sputtering and a backing plate bonded to the sputtering member. As the backing plate, a metal or alloy having a superior thermal conductivity is used such as OFC (oxygen-free copper), Cu alloy, Al, Al alloy, SUS (stainless steel), Ti or Ti alloy or the like.

When carrying out a sputtering, the sputtering target assembly is mounted on a sputtering apparatus, and the backing plate is cooled. Thus, a heat generated in the target member during the sputtering is absorbed by the backing plate so as to prevent temperature increase of the target member.

Conventionally, bonding between the target member and the backing plate has been carried out mainly by using a soldering material such as In or Sn alloy. However, soldering using soldering materials of low melting point have following defects.

Firstly, the soldering material has a low melting point such as 158° C. of In and 160 to 300° C. of Sn alloys. Consequently, as the temperature during sputtering approaches the melting point, the bonding shear strength is abruptly decreased.

Secondly, the bonding shear strength at the room temperature is as low as 100 $kg/cm^2$ for In, and 200 to 400 $kg/cm^2$ for the Sn alloys. Moreover, these are low melting point soldering materials. Consequently, as the temperature increases, the bonding shear strength is further lowered.

Thirdly, when the soldering material is solidified and shrunk during bonding, there is a tendency that pores are left between the target member and the backing plate, which makes it difficult to obtain a 100% bonding without leaving any unbonded portion.

Thus, by the soldering method, it is difficult to bond the target member to the backing plate with a sufficient strength, as this limits to a low level the power applied during sputtering. That is, when using the soldering method, if a sputtering power above a nominal value is applied or if control of a cooling water is insufficient for example, the bonding strength between the target member and the backing plate is lowered as the temperature of the target member increases. Furthermore, if the temperature reaches the melting point of the soldering material, the soldering material is melted and the target member is peeled out from the backing plate. In order to solve these problems, there has been consideration to use, instead of the soldering materials having a low melting point, a brazing material of high melting point. However, if a brazing material of a high melting point is used, the brazing process requires a high temperature, which adversely affects the quality of the target member. That is, a brazing material of a high melting point cannot be used in practice.

As has been described above, the soldering method limits to a low level the power applied for sputtering. On the other hand, in order to improve a throughput of a film forming by sputtering, there is a tendency to increase the power for sputtering. For this, it is desired to prepare a sputtering target assembly which can be maintained at a predetermined bonding strength between the target member and the backing plate even under a high temperature.

In order to achieve this, Japanese Patent Laid-Open Hei 4-143269 discloses a method for bonding a target member with a backing plate directly or via a spacer having a higher melting point than the target member. Here, the bonding between the target member and the backing plate into a unitary body is carried out by way of an explosive bonding and other methods such as hot press method, HIP method, and hot roll method.

However, these methods require that the target member be bonded with the backing plate under a significantly large shock or load. The target member is deformed, which in turn causes an internal distortion and tissue change as well as contamination of the surface portion. Consequently, these methods cannot be applied to a target member in which a crystal grain size and crystalline axis direction are adjusted.

Moreover, Japanese Patent Laid-Open Hei 6-158296 discloses a method of bonding a target member made from Ti having a crystal grain size of 100 $\mu$m or below with a backing plate made from Ti by way of solid phase diffusion bonding. More specifically, the target member is bonded to the backing plate in a vacuum under the conditions of: strain rate $1 \times 10^{-3}$/sec or below; pressure applied 0.1 to 20 $kg/mm^2$; and the temperature 350 to 650°C. Japanese Patent Laid-Open Hei 6-158296 mentions that this method enables to obtain a 100% bonding of a high adherence strength and a high bonding strength without leaving any unbonded portion.

Actually, however, the solid phase diffusion boding is still insufficient to obtain a sufficient bonding strength. Especially, it is difficult to obtain a sufficient tensile strength.

SUMMARY OF THE INVENTION

It is therefore an object of the present invention to provide a method for producing a sputtering target assembly consisting of a target member bonded to a backing plate which enables to obtain a high adherence strength and a high bonding strength as well as a sufficient tensile strength.

In order to achieve the aforementioned object, the inventor conducted various experiments and found that when the target member and the backing plate have bonding surfaces which are sufficiently made flat and these are bonded by way of solid phase diffusion bonding, it is possible to obtain a high adherence strength and a high bonding strength s well as a sufficient tensile strength.

If the target member and the backing plate have rough bonding surfaces, a vacancy is caused between these bonding surfaces and even if these surfaces are bonded to each other by way of the solid phase diffusion bonding, it is impossible to obtain a uniform and sufficient tensile strength. Therefore, the present invention employs a target member and a backing plate whose bonding surfaces are made sufficiently flat before carrying out the solid phase diffusion bonding.

That is, in the sputtering target assembly production method according to the present invention, when producing a sputtering target assembly consisting of a target member used for sputtering and a backing plate bonded to the target member, bonding surfaces of the target member and the backing plate are made flat so as to have an arithmetic mean roughness Ra of 0.01 to 1.0 µm before carrying out the solid phase diffusion bonding between the target member and the backing plate.

Here, a pressure applied when carrying out the solid phase diffusion bonding is preferably 140 to 200 kg/cm$^2$, and a temperature when carrying out the solid phase diffusion bonding is preferably 450 to 600° C. Moreover, the aforementioned target member may be made from Ti or Ti alloy, whereas the aforementioned backing plate may be made from Al or Al alloy. It should be noted that when the target member is made from Ti or Ti alloy, the crystal grain size is preferably 100 µm or below.

In the sputtering target assembly production method acceding to the present invention as described above, the target member and the backing plate have bonding surfaces which are made sufficiently flat before bonded to each other by way of the solid phase diffusion bonding. Consequently, there is no danger of causing a vacancy between the bonding surfaces, enabling to surely bond the target member with the backing plate.

DETAILED DESCRIPTION OF THE PREFERRED EMBODIMENTS

Description will now be directed to preferred embodiments of the present invention with reference to the attached drawings. It should be noted that the present invention will not be limited to the embodiments below but can be modified in various ways within a scope of the present invention.

Figure 1:
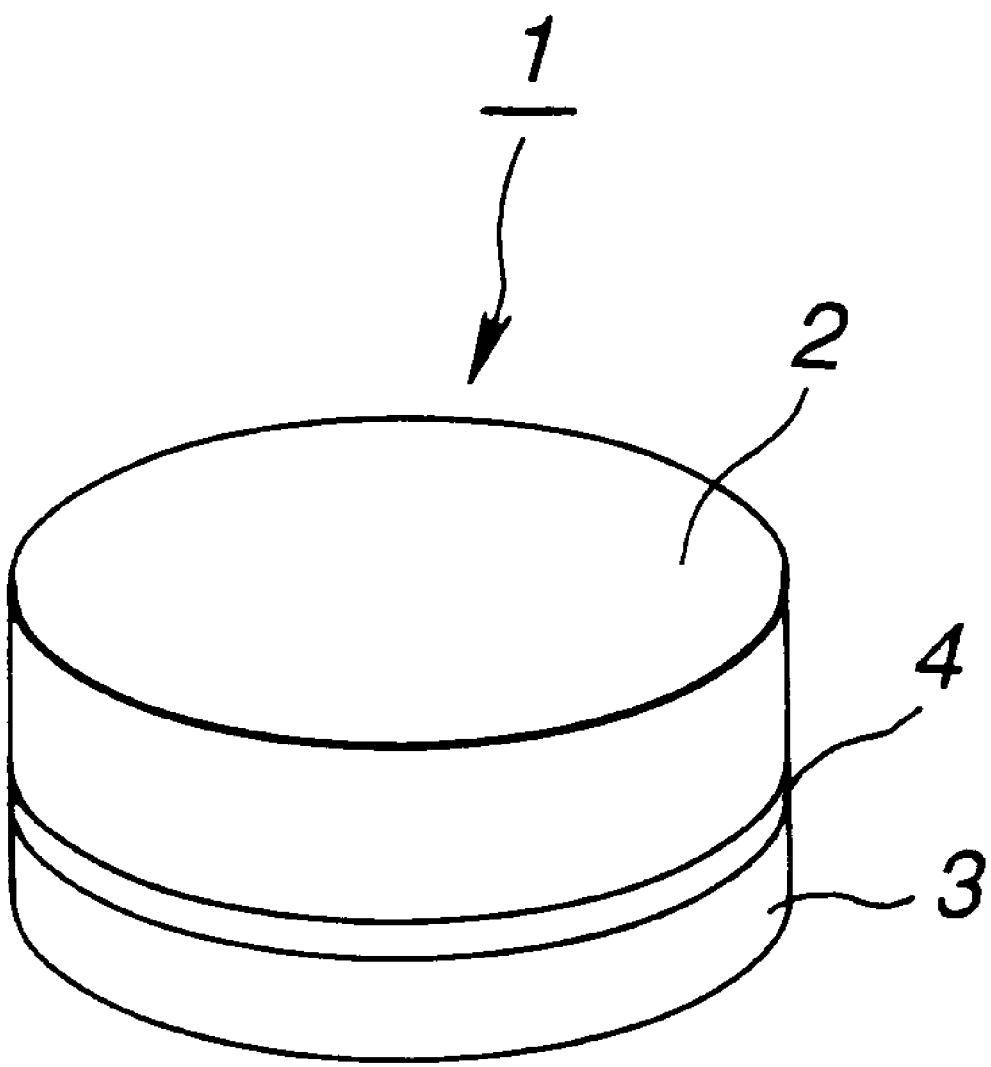
FIG. 1 is a perspective view showing an example of a sputtering target assembly produced according to the present invention.

FIG. 1 shows an example of a sputtering target assembly produced according to the present invention. This sputtering target assembly consists of a target member 2 and a backing plate 3 which are firmly bonded to each other through a solid phase diffusion bonding interface 4.

Here, the target member 2 serves as a sputtering source when forming a film by sputtering and is made from a material used for forming the film. The target member 2 which can be used in the present invention is made from a material which can be bonded by way of solid phase diffusion bonding to the backing plate 3. More specifically, Ti, Ti alloy, Al, Al alloy and the like can be used. Here, as the Ti alloy used for the target member 2, there can be exemplified a Ti alloy prepared from Ti by addition of 10 weight % or below of Al, Sn, V or W. It should be noted that when using Ti or Ti alloy for the target member 2, is preferable that a crystal grain size be 100 µm or below. By using such a small crystal grain size, it is possible to lower a quantity of particles generated during a sputtering.

On the other hand, the backing plate 3 serves to cool the target member 2 during a sputtering and is made from a material having a superior thermal conductivity. The backing plate 3 which can be used in the present invention is made from a material which can be bonded by way of solid phase diffusion bonding to the target material 2. More specifically, there can be exemplified Al, Al alloy, OFC (oxygen-free copper), Cu alloy, Ti, Ti alloy, SUS (stainless steel) and the like.

Figure 2:
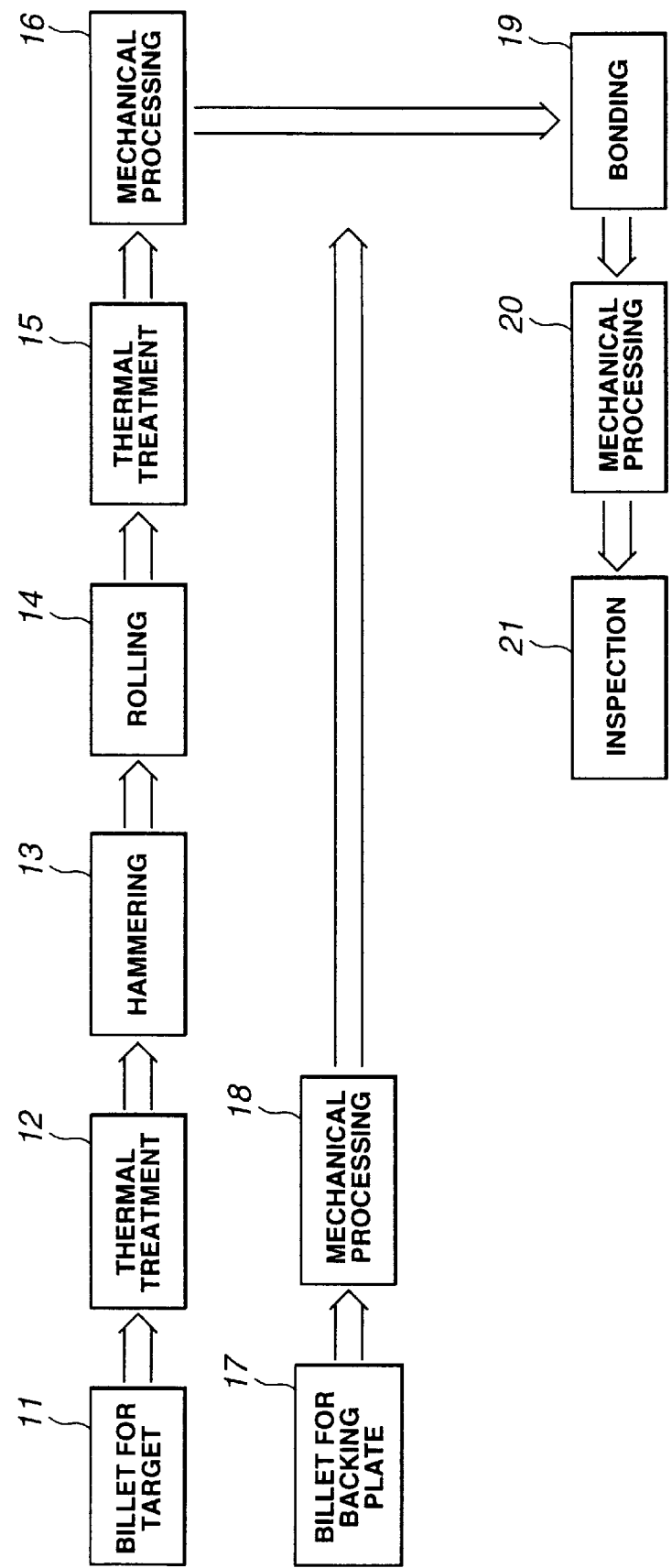
FIG. 2 shows an example of production procedure of a sputtering target assembly according to the present invention.

Next, a production procedure for producing the sputtering target assembly 1 shown in FIG. 1 will be detailed below with reference to FIG. 2.

For producing the sputtering target assembly 1, firstly, it is necessary to prepare the target member 2 of a predetermined shape and the backing plate 3 of a predetermined shape.

In order to obtain the target member 2, firstly, a billet 11 made from the material of the target member 2 is subjected to a thermal treatment 12 and a hammering 13 and then rolling 14 so as to be rolled into a predetermined configuration. These processes of the thermal treatment 12, the hammering 13, and the rolling process 14 determine the crystal grain size and the crystal axis direction of the target member 2. After this, if necessary, a thermal treatment 15 is further carried out before carrying out a mechanical processing 16.

According to the present invention, in this mechanical processing 16, mirror treatment is carried out to at least a bonding surface of the target member 2 which will be bonded to the backing plate 3, so as to obtain an arithmetic mean roughness Ra of 0.01 to 1.0 µm. After this mirror treatment, the target member 2 is subjected to a degrease and a washing process by using an organic solvent such as isopropyl alcohol (IPA), acetone or ethanol and the like. Thus, the target member 2 is complete.

On the other hand, in order to produce the backing plate 3, a billet 17 made from the material of the backing plate 3 is subjected to a mechanical processing 18 so as to be made into a predetermined configuration. It should be noted that there is no problem of crystal grain size or crystal axis direction when producing the backing plate 3. Consequently, there is no need of the thermal treatment, hammering or rolling carried out when producing the target member 2. Moreover, according to the present invention, during the mechanical processing 18, mirror treatment is carried out to at least a bonding surface of the backing plate 3 which will be boned to the target member 2, so as to obtain a flat surface having an arithmetic mean roughness Ra of 0.01 to 1.0 μm. After this mirror treatment, the backing plate 3 is subjected to a degrease process and washing by using an organic solvent such as isopropyl alcohol (IPA), acetone or ethanol and the like. The backing plate 3 is produced by the above steps.

It should be noted that the mirror treatment carried out to the target member 2 and the backing plate 3 may be a mechanical grinding or a mechanochemical treatment using a mechanical grinding and chemical etching in combination. For example, the mechanochemical treatment can be carried out by using a polishing liquid containing a grinding grain such as colloidal silica, $SiO_2$ ultragrain (amicron), diamond or $ZrO_2$ grain in an amount of 10 to 40 weight % dispersed in an alkelescent solvent of pH 9.0 to 12.0, so that an object is polished by mechanical grinding by the grain contained in the polishing liquid and the chemical etching by the alkali solution in combination. In such a mechanochemical polishing, it is possible to control speed of the chemical polishing by changing pH of the polishing solution and to control speed of the mechanical grinding by changing the type and concentration of the grain contained in the polishing liquid.

Subsequently, the target member 2 and the backing plate 3 which have been thus produced are arranged so that their bonding surfaces which have been subjected to the mirror treatment are in contact with each other and are subjected to a bonding process 19. Here, the bonding process 19 is carried out by way of the solid phase diffusion bonding. In this solid phase diffusion bonding, atoms from the bonding surface of the target member 2 and the atoms from the bonding surface of the backing plate 3 are diffused to each other, thus bonding the target member 2 and the backing plate 3 to each other. With this solid phase diffusion bonding, it is possible to obtain a high adherence rate and a high bonding strength.

Here, the solid phase diffusion bonding is carried out in a vacuum atmosphere of 10 Torr or below. This is required to prevent forming of an oxide during the solid phase diffusion bonding process. Note that it is preferable to carry out the solid phase diffusion bonding in an atmosphere of a lower pressure but actually it is difficult to obtain an extremely low pressure. Accordingly, it is practical to carry out the solid phase diffusion bonding in an vacuum atmosphere of 0.01 to 1.0 Torr.

The pressure to be applied during the solid phase diffusion bonding is preferably 90 to 200 kg/cm$^2$ and more preferably 140 to 160 kg/cm$^2$.

Here, the lower limit of the pressure applied when carrying out the solid phase diffusion bonding is defined to be 90 kg/cm$^2$ because a pressure less than 90 kg/cm$^2$ cannot generate a sufficient diffusion in the bonding interface required for carrying out a preferable solid phase diffusion bonding. Moreover, the lower limit of the pressure applied is more preferably 140 kg/cm$^2$ or above, because such a sufficiently large pressure enables to obtain bonding of a higher strength.

On the other hand, the upper limit of the pressure applied when carrying out the solid phase diffusion bonding is defined as 200 kg/cm$^2$, because a pressure exceeding 200 kg/cm$^2$ may deform or damage the target member 2 and the backing plate 3. The upper limit of the pressure is more preferably 160 kg/cm$^2$ or below so as to be sure to evade the aforementioned damage or deformation.

The temperature for the solid phase diffusion bonding is preferably 450 to 600° C. and more preferably 460 to 500° C.

Here, the lower limit of the temperature when carrying out the solid phase diffusion bonding is defined to be 450° C., because a temperature below 450° C. cannot bring about a sufficient diffusion required for carrying out a preferable solid phase diffusion bonding. Moreover, the lower limit of the temperature is more preferably 460° C. or above which is sufficiently high so as to bring about a sufficient diffusion of atoms in the bonding interface, which in turn brings about a more preferable solid phase diffusion bonding of a higher strength.

On the other hand, the upper limit of the temperature when carrying out the solid phase diffusion boding is defined to be 600° C., because a temperature exceeding 600° C. may cause growth of crystal grains in the target member 2. Moreover, such a high temperature exceeding 600° C. may deform or melt the backing plate 3. The upper limit of the temperature is more preferably 500° C. or below so as to be sure to evade the aforementioned problems of crystal grain growth in the target member 2 and the thermal deformation or melting of the backing plate 3.

It should be noted that the optimal value of the pressure to be applied when carrying out the solid phase diffusion bonding depends on the temperature during the solid phase diffusion bonding process and the materials used as the target member 2 and the backing plate 3. Similarly, the optimal value of the temperature for carrying out the solid phase diffusion bonding also depends on the pressure applied during the solid phase diffusion bonding and the materials used as the target member 2 and the backing plate 3. Consequently, the optimal value of the pressure applied during the solid phase diffusion bonding and the optimal value of the temperature during the solid phase diffusion bonding are to be selectively set, considering various conditions including the materials used for the target member 2 and the backing plate 3.

In the solid phase diffusion bonding as described above, the temperature during bonding is comparatively low and will not cause changes in the crystal grain size or crystal axis direction of the target material 2. Moreover, in the above solid phase diffusion bonding, the pressure applied during bonding is comparatively low and will not cause uneven distortion or tissue changes in the target member 2. Furthermore, the solid phase diffusion bonding will not cause pores in the contact interface, enabling to obtain a high adherence and a high bonding strength. Thus, the solid phase diffusion bonding enables to bond the target member 2 with the backing plate 3 causing almost no affect to the target member 2.

Especially according to the present invention, the bonding surfaces of the target member 2 and the backing plate 3 are made flat to have an arithmetic mean roughness Ra of 0.01 to 1.0 μm. Consequently, no vacancy is left between the target member 2 and the backing plate 3, enabling to bond the entire area of the bonding surfaces of the target member 2 and the backing plate 3. That is, according to the present invention, the bonding surfaces of the target member 2 and the backing plate 3 are made flat with a high accuracy so that solid phase diffusion bonding is preferably carried out over the entire area of the bonding surfaces, thus bonding with a high strength the bonding surface of the target member 2 with the bonding surface of the backing plate 3.

It should be noted that in order to improve the bonding strength between the target member 2 and the backing plate 3, the bonding surface may have an arithmetic mean roughness Ra below 0.01 mm. However, in order to obtain the arithmetic mean roughness below 0.01 μm, the mirror treatment requires a plenty of time and processes. Consequently, the arithmetic mean roughness Ra of the bonding surface is preferably 0.01 μm or above in practice.

By the aforementioned processing steps, the target member 2 is bonded to the packing plate 3 by way of the solid phase diffusion bonding, thus completing the sputtering target assembly 1. The sputtering target assembly 1 thus produced is normally subjected to a mechanical processing 20 so as to have predetermined dimensions and an inspection step 21 for checking the bonding state by using an ultrasonic examination apparatus before shipment.

Description will now be directed to specific samples of the sputtering target assembly 1 prepared by bonding the target member 2 and the backing plate 3 and checking results of their bonding strength.

Note that the target member 2 used for the samples is made from a titanium of a high purity 99.998% or above and has a diameter of 300 mm. The backing plate 3 used is made from an industrial aluminium (A6061P).

Figure 3:
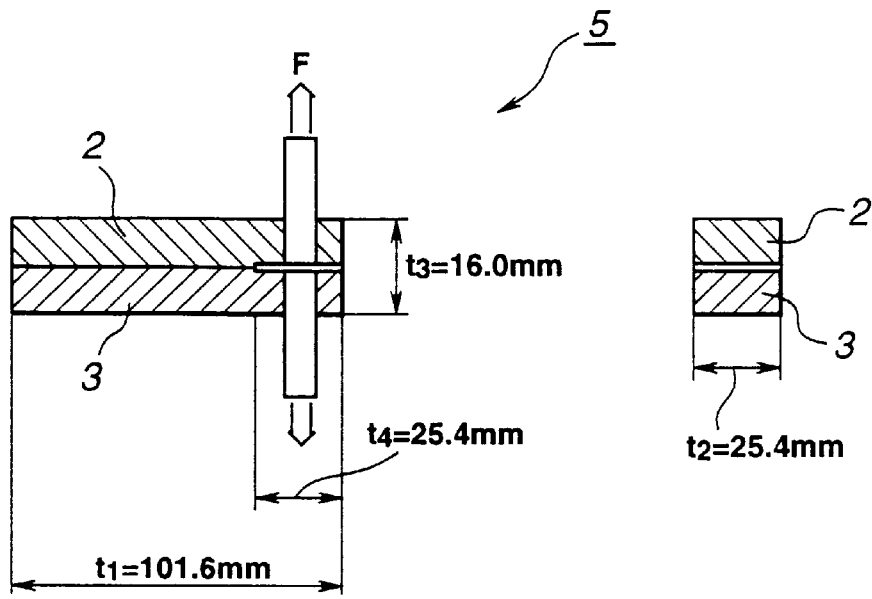
FIGS. 3A and 3B schematically shows a tensile strength measurement process.

The bonding strength was measured as shown in FIG. 3 by using a precision test apparatus produced by Simazu Seisakusyo. That is, a sample piece 5 was cut from a sputtering target assembly 1 consisting of the target member 2 bonded to the backing plate 3 and a force F was applied to the sample piece 5 in the direction to separate the target member 2 and the backing plate 3 from each other. Here, the sample piece 5 has a length t1 of 101.6 mm, width t2 of 25.4 mm, and a height t3 of 16.0 mm. The force F was applied to the end portion of the sample piece 5 in an area of length t4 25.4 mm and width equivalent to the width t2 of the sample piece, i.e., 25.4 mm. The temperature during the measurement was set to 25° C. excluding Experiment 4 which will be detailed later, and the cross head speed during the measurement was set to 0.5 mm/min. Note that the maximum tensile load was set to 1000 kgf for measuring the tensile strength but approximately 600 kgf was the measurement limit because a tensile load of about 600 kgf or above caused plastic deformation in the sample piece 5.

Experiment 1

In this experiment, a plurality of sputtering target assemblies 1 were prepared by changing the pressure in a range of 40 to 200 kg/cm² applied to the target member 2 and the backing plate 3 in the solid phase diffusion bonding process. Samples obtained were subjected to the aforementioned tensile strength measurement. Note that in this experiment, the bonding surfaces of the target member 2 and the backing plate 3 had an arithmetic mean roughness Ra of 3.0 μm when the target member 2 and the backing plate 3 were bonded to each other by way of the solid phase diffusion bonding in a vacuum of 1 Torr with the bonding temperature of 480° C., and maintained for 0.5 hour.

Figure 4:
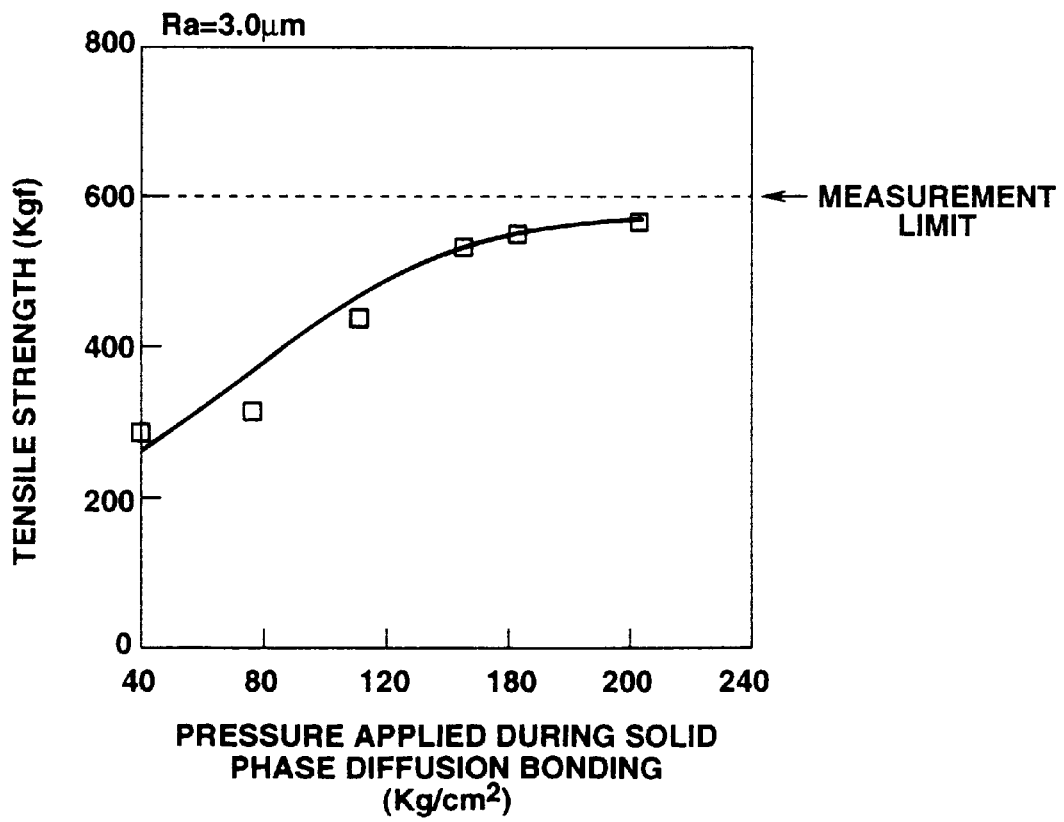
FIG. 4 shows a relationship between the pressure applied for solid phase diffusion bonding and the tensile strength.

FIG. 4 shows the relationship between the pressure applied during the solid phase diffusion bonding and the tensile strength obtained. As shown in FIG. 4, as the pressure applied during the solid phase diffusion bonding was increased, the tensile strength was also increased, reaching near the measurement limit at about 140 kg/cm², after which the tensile strength remained almost unchanged even if the pressure applied during the solid phase diffusion bonding was increased. This means that the pressure to be applied to the target member 2 and the backing plate 3 during the solid phase diffusion bonding is preferably 140 kg/cm² or above.

Experiment 2

In this experiment, four samples of the sputtering target assembly 1 were prepared by using the target member 2 and the backing plate 3 each having a bonding surface with the arithmetic mean roughness Ra of 0.01 μm, 0.3 μm, 1.0 μm, and 3.0 mm, and these four samples were subjected to the aforementioned tensile strength measurement. Note that the solid phase diffusion bonding was carried out in a vacuum of 1 Torr at the bonding temperature of 480° C. with a pressure of 162 kg/cm² and the samples were maintained for 0.5 hour.

Figure 5:
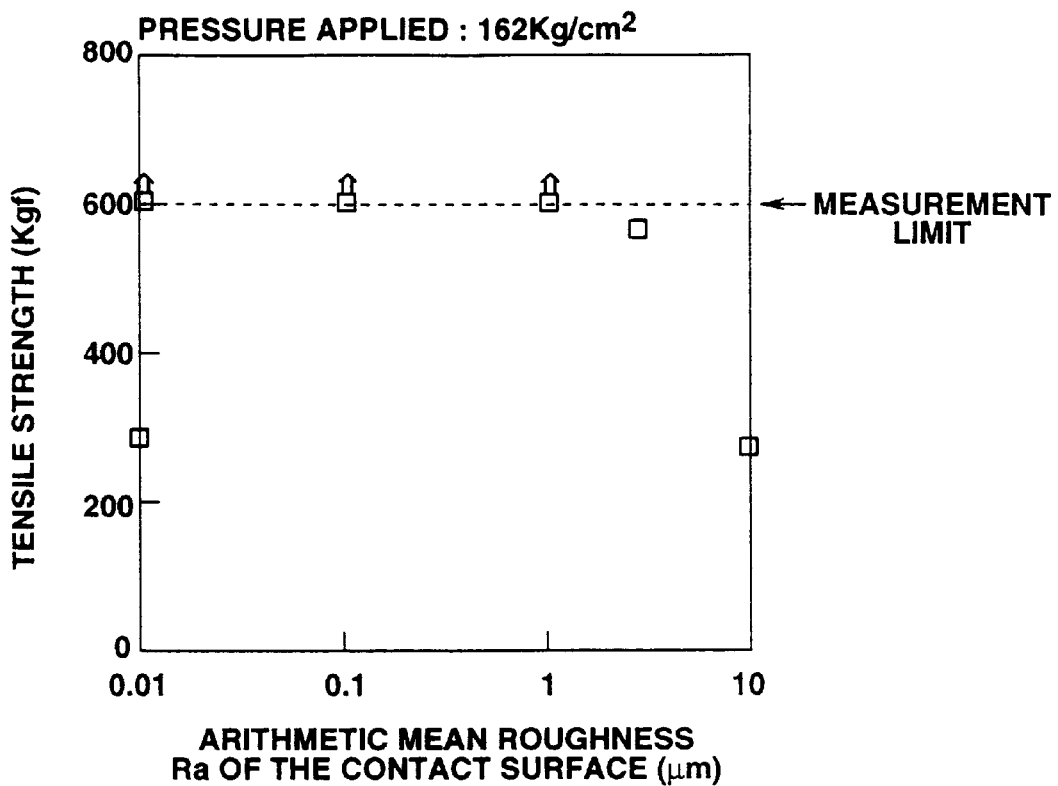
FIG. 5 shows a relationship between the arithmetic mean roughness Ra of the bonding surface and the tensile strength.

FIG. 5 shows the relationship between the arithmetic mean roughness Ra of the bonding surface and the tensile strength measured. Note that in FIG. 5 and FIG. 7 to FIG. 10 which will be explained later, an upward arrow indicates that plastic deformation was caused in the backing plate 3 during the tensile strength measurement when the tensile strength reached the measurement limit.

As shown in FIG. 5, the tensile strength reached the measurement limit when the arithmetic mean roughness Ra was 0.01 to 1.0 μm. This shows that when the bonding surfaces of the target member 2 and the backing plate 3 have an arithmetic mean roughness Ra of 0.01 to 1.0 μm prior to the solid phase diffusion bonding, the solid phase diffusion soldering is preferably carried out, firmly bonding the target member 2 and the backing plate 3 to each other.

Experiment 3

Figure 6:
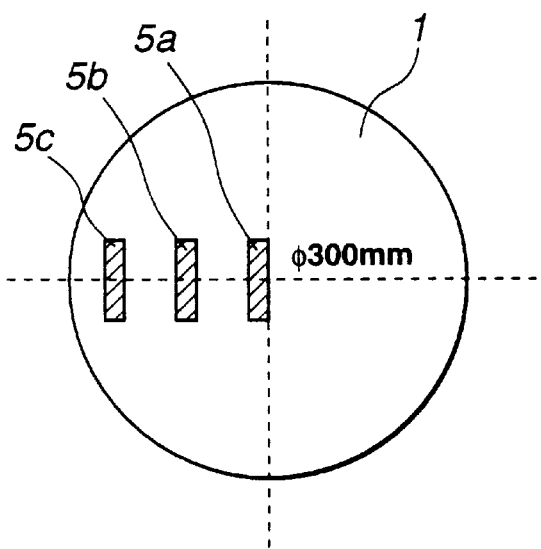
FIG. 6 schematically shows a process to cut off test samples from a sputtering target assembly.

In this experiment, three samples of the sputtering target assembly 1 were prepared by defining the arithmetic mean roughness Ra to be 0.3 μm, 1.0 μm, and 3.0 μm on the bonding surfaces of the target member 2 and the backing plate 3, and the tensile strength of these sputtering target assemblies 1 were checked in different positions in the radius direction. That is, as shown in FIG. 6, a test piece 5a was cut off from the vicinity of the center of the prepared sputtering target 1, a test piece 5b was cut off from the position of 65 mm from the center in the radius direction, and a test piece 5c was cut off from the position of 130 mm from the center in the radius direction. These test pieces were subjected to the tensile strength check. Note that the solid phase diffusion bonding was carried out in a vacuum of 1 Torr at a bonding temperature of 480° C. for 0.5 hour under a pressure of 148 kg/cm².

Figure 7:
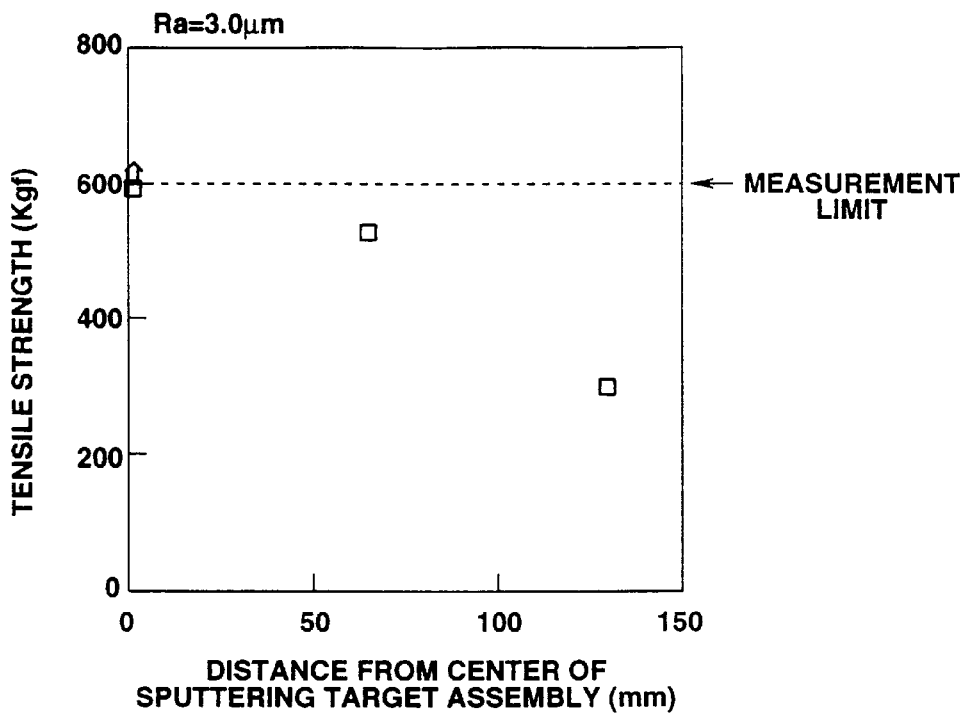
FIG. 7 shows the tensile strength dependency in the radius direction when the arithmetic mean roughness Ra of the bonding surface is 3.0 µm.
Figure 8:
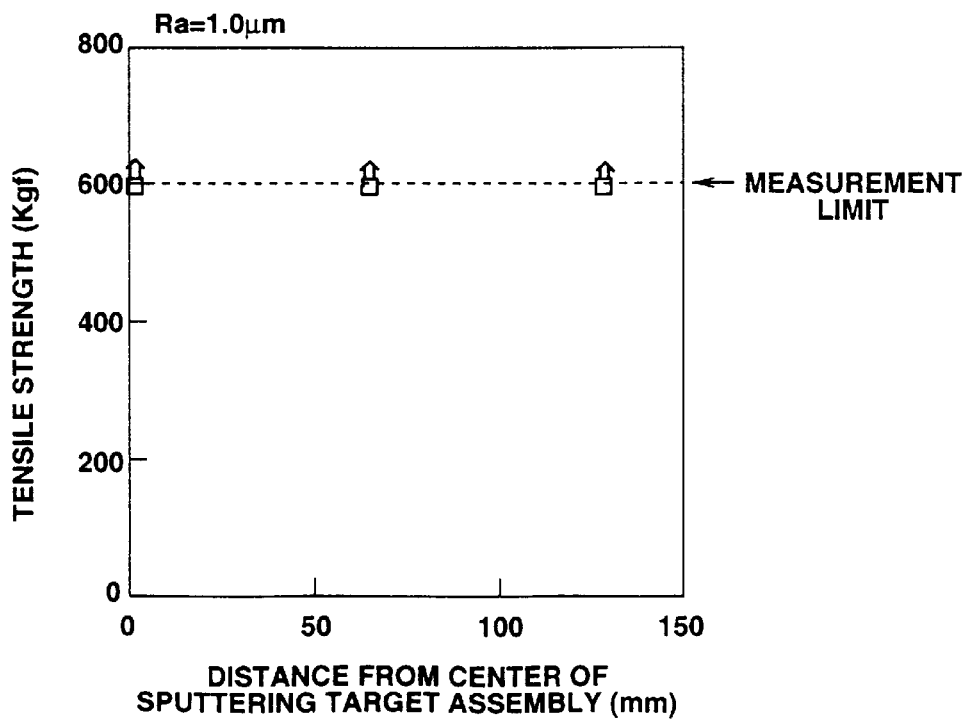
FIG. 8 shows the tensile strength dependency in the radius direction when the arithmetic mean roughness Ra of the bonding surface is 1.0 µm.
Figure 9:
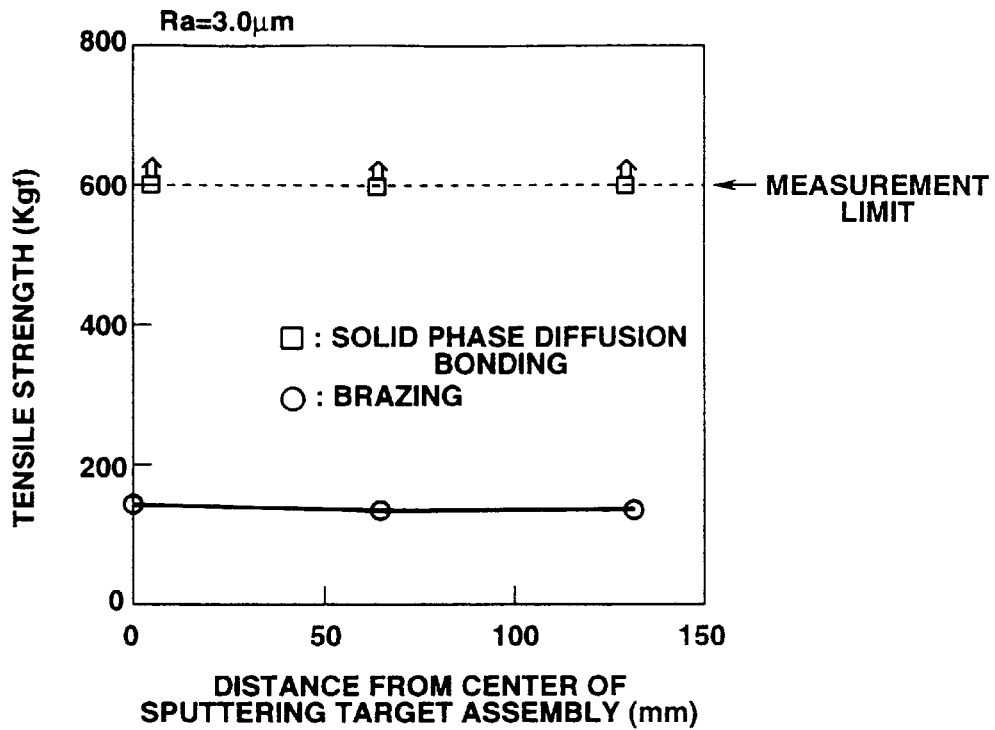
FIG. 9 shows the tensile strength dependency in the radius direction when the arithmetic mean roughness Ra of the bonding surface is 0.3 µm.

FIG. 7 shows the tensile strength dependency on the position in the radius direction when the arithmetic mean roughness Ra of the bonding surfaces was 3.0 μm. FIG. 8 shows the tensile strength dependency on the position in the radius direction when the arithmetic mean roughness Ra of the bonding surfaces was 1.0 μm. FIG. 9 shows the tensile strength dependency on the position in the radius direction when the arithmetic mean roughness Ra of the bonding surfaces was 0.3 μm. FIG. 9 also shows results of check of tensile strength dependency on the position in the radius direction when the target member 2 and the backing plate 3 were bonded to each other by way of the conventional brazing method.

As shown in FIG. 7, when the arithmetic mean roughness Ra of the bonding surfaces was 3.0 μm, the tensile strength was decreased from the center toward the outer circumference of the sputtering target assembly 1. On the other hand, as shown in FIG. 8 and FIG. 9, when the arithmetic mean roughness Ra of the bonding surfaces was 1.0 μm and 0.3 μm, the tensile strength reached the measurement limit over the entire surface of the sputtering target assembly 1. From these results, it can be said that when the target member 2 and the backing plate 3 have bonding surfaces of the arithmetic mean roughness Ra equal to or below 1.0 μm, the solid phase diffusion bonding can be carried out preferably over the entire surface of the bonding surfaces so that the target member 2 and the backing plate 3 are firmly bonded to each other.

Moreover, as shown in FIG. 9, when the target member 2 and the backing plate 3 were bonded by way of brazing, the tensile strength remained at the level of 150 kgf even when the arithmetic mean roughness Ra of the bonding surfaces was 0.3 mm. In contrast to this, when the target member 2 and the backing plate 3 were bonded by way of the solid phase diffusion bonding, the tensile strength reached the measurement limit over the entire surface of the puttering target assembly 1. It is clear that by bonding the target member 2 and the backing plate 3 by way of the solid phase diffusion bonding according to the present invention, it is possible to obtain a bonding strength by far greater than the brazing method.

Experiment 4

In this experiment, the tensile strength dependency on the temperature was checked for the sputtering target assemblies 1 prepared. That is, in this experiment, the tensile strength of the sputtering target assembly 1 was measured at the temperature of 25° C., 150° C., and 300° C.

Note that a sample of the sputtering target assembly 1 used in this experiment was prepared by using a target member 2 and a backing plate 3 each having an arithmetic mean roughness Ra of 0.3 µm which were bonded to each other by way of solid phase diffusion bonding in a vacuum of 1 Torr at a bonding temperature of 480° C. for 0.5 hour under a pressure of 162 kg/cm².

Figure 10:
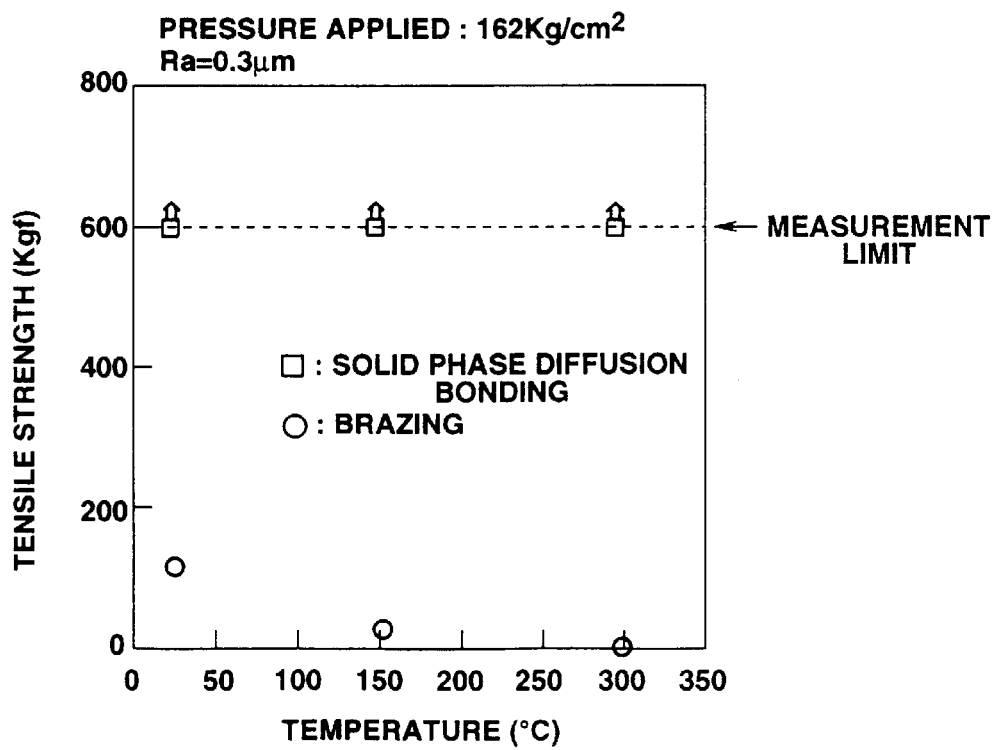
FIG. 10 shows a relationship between the tensile strength and the temperature of the sputtering target assembly.

FIG. 10 shows the relationship between the tensile strength of the sputtering target assembly 1 and the temperature. Note that FIG. 10 also shows a relationship between the tensile strength and the temperature when the target member 2 and the backing plate 3 were bonded to each other by way of brazing.

As shown in FIG. 10, the sputtering target assembly 1 prepared according to the present invention exhibits a firm bonding state independently of the temperature. Even at the temperature as high as 300 C., the sputtering target assembly 1 prepared according to the present invention showed the tensile strength reaching the measurement limit.

On the other hand, the sputtering target assembly prepared by brazing decreased its tensile strength as the temperature increased, reaching the level of 10 kgf at the temperature of 150° C. Furthermore, when the temperature reached 300° C., the brazing material was melted and the tensile strength became zero. That is, the sputtering target assembly 1 prepared by way of the solid phase diffusion bonding according to the present invention maintains a firm bonding state even under a high temperature, which shows its superiority to the sputtering target assembly prepared by way of brazing.

As is clear from the above explanations, the present invention employs the solid phase diffusion bonding for bonding a target member and a backing plate, which will not generate pores on the bonding surfaces, realizing a 100% adherence without leaving any unbonded portion. Moreover, the sputtering target assembly prepared according to the present invention in which a target member and a backing plate are bonded to each other by way of the solid phase diffusion bonding has a bonding strength which is not abruptly decreased as the service temperature increases like in the case brazing using a brazing material of a low melting point.

Moreover, according to the present invention, bonding surfaces of the target member and the backing plate are made sufficiently flat before being bonded to each other by way of the solid phase diffusion bonding, which enables to produce a sputtering target assembly exhibiting a high adherence strength and a high bonding strength as well as a sufficient tensile strength even under a high temperature.

As has thus far been described, according to the present invention, it is possible to provide a sputtering target assembly in which the bonding between the target member and the backing plate is firmly maintained even under a high temperature. As a result, for example, it is possible to increase the power applied during a sputtering process.

Furthermore, because the present invention employs the solid phase diffusion bonding method, it is possible to bond the target member and the backing plate at a comparatively low temperature. Consequently, there is a merit that no crystal growth is caused in the target material. Moreover, according to the present invention which employs the solid phase diffusion bonding method, there is no need to apply a large pressure to the target member and the backing plate. Consequently, there is another merit that there is no danger of damaging the target member when bonding the target member and the backing plate.

What is claimed is:

1. A method for producing a sputtering target assembly consisting of a target member used for sputtering and a backing plate bonded to said target member, comprising the steps of:

making bonding surfaces of said target member and backing plate flat so as to have an arithmetic mean roughness Ra of 0.01 to 1.0 µm before bonded to each other by way of solid phase diffusion bonding, and bonding said target member and backing plate together using solid phase diffusion bonding.

2. A method for producing a sputtering target assembly as claimed in claim 1, wherein said solid phase diffusion bonding is carried out by applying a pressure of 140 to 200 kg/cm².

3. A method for producing a sputtering target assembly as claimed in claim 1, wherein said solid phase diffusion bonding is carried out under a temperature of 450 to 600 C.

4. A method for producing a sputtering target assembly as claimed in claim 1, wherein said target member is made from Ti or Ti alloy.

5. A method for producing a sputtering target assembly as claimed in claim 4, wherein said target member has a crystal grain size of 100 µm or below.

6. A method for producing a sputtering target assembly as claimed in claim 1, wherein said backing plate is made from Al or Al alloy.

7. The method of claim 1, wherein said solid phase diffusion bonding is carried out under a temperature of 450° to 600° C. and by applying a pressure of 140 to 200 kg/cm² between said target member and said backing plate.

8. A method for producing a sputtering target assembly as claimed in claim 7, wherein said target member is made from Ti or Ti alloy.

9. A method for producing a sputtering target assembly as claimed in claim 7 or 8, wherein said target member has a crystal grain size of 100 µm or below.

10. A method for producing a sputtering target assembly as claimed in claim 7 or 8, wherein said backing plate is made from Al or Al alloy.

11. A method for producing a sputtering target assembly as claimed in claim 9, wherein said backing plate is made from Al or Al alloy.

12. A method for making a sputtering target assembly, comprising the steps of:

providing bonding surfaces of each of a target member and a backing plate with an arithmetic mean roughness of 0.01 to 1.0 µm, and bonding said bonding surfaces together using solid phase diffusion bonding with applied pressure of 140 to 200 kg/cm² and at a temperature of 450° to 600° C., wherein, said target member is made of Ti or Ti alloy, and said target member has a crystal grain size of 100 µm or less.

* * * * *